(12) United States Patent  
Kanai

(10) Patent No.: US 6,865,128 B2
(45) Date of Patent: Mar. 8, 2005

(54) NON-VOLATILE MEMORY DEVICE

(75) Inventor: Masahiro Kanai, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/733,455

(22) Filed: Dec. 12, 2003

(65) Prior Publication Data

US 2004/0151045 A1 Aug. 5, 2004

(30) Foreign Application Priority Data

Dec. 16, 2002 (JP) ........................................ 2002-364047

(51) Int. Cl.[7] ................................................. G11C 7/00
(52) U.S. Cl. ................... 365/203; 365/229; 365/185.25
(58) Field of Search ................................ 365/203, 229, 365/185.25

(56) References Cited

U.S. PATENT DOCUMENTS

| 5,408,115 A | 4/1995 | Chang |
| 5,422,504 A | 6/1995 | Chang et al. |
| 5,494,838 A | 2/1996 | Chang et al. |

(List continued on next page.)

FOREIGN PATENT DOCUMENTS

| JP | A 6-181319 | 6/1994 |
| JP | A 7-161851 | 6/1995 |
| JP | A 11-74389 | 3/1999 |
| JP | B1 2978477 | 9/1999 |
| JP | A 2001-156188 | 6/2001 |

OTHER PUBLICATIONS

U.S. Appl. No. 10/728,746, filed Dec. 8, 2003, Natori.
Hayashi et al. "Twin MONOS Cell with Dual Control Gates", 2000 Symposium on VLSI Technology Digest of Technical Papers, 2000 IEEE.
Chang et al. "A New SONOS Memory Using Source–Side Injection for Programming", IEEE Electron Device Letters, vol. 19, No. 7, Jul. 1998, pp 253–255.
Chen et al. "A Novel Flash Memory Device with Split Gate Source Side Injection and ONO Charge Storage Stack (SPIN), 1997 Symposium on VLSI Technology Digest of Technical Papers", pp 63–64.

*Primary Examiner*—Richard Elms
*Assistant Examiner*—N. Nguyen
(74) *Attorney, Agent, or Firm*—Oliff & Berridge, PLC

(57) ABSTRACT

A high-speed accessible non-volatile memory device including: a memory cell array which has a plurality of memory cells arranged in a row direction and a column direction, and a precharge voltage supply section. The memory cell has a source region, a drain region, a word gate and a select gate disposed to face a channel region provided between the source region and the drain region, and a non-volatile memory element formed between the word gate and the channel region. The precharge voltage supply section supplies a precharge voltage to all the word gates in the memory cell array during standby mode.

12 Claims, 14 Drawing Sheets

U.S. PATENT DOCUMENTS

| | | |
|---|---|---|
| 5,696,383 A | 12/1997 | Cheng |
| 6,177,318 B1 | 1/2001 | Ogura et al. |
| 6,248,633 B1 | 6/2001 | Ogura et al. |
| 6,255,166 B1 | 7/2001 | Ogura et al. |
| 6,587,380 B2 | 7/2003 | Kanai et al. |
| 6,587,381 B2 | 7/2003 | Kanai et al. |
| 6,646,916 B2 | 11/2003 | Kamei |
| 6,650,591 B2 | 11/2003 | Owa |
| 6,707,695 B2 | 3/2004 | Owa |
| 6,707,720 B2 | 3/2004 | Kamei et al. |
| 6,707,742 B2 | 3/2004 | Kamei et al. |
| 6,735,118 B2 * | 5/2004 | Ogura et al. ........... 365/185.18 |
| 2002/0191453 A1 | 12/2002 | Owa |
| 2003/0007387 A1 * | 1/2003 | Ogura et al. ........... 365/185.18 |
| 2003/0020123 A1 | 1/2003 | Kanai |
| 2003/0025149 A1 | 2/2003 | Kanei |
| 2003/0025150 A1 | 2/2003 | Kanai et al. |
| 2003/0027411 A1 | 2/2003 | Kanei |
| 2003/0031064 A1 | 2/2003 | Natori |
| 2003/0034530 A1 | 2/2003 | Kamei |
| 2003/0048674 A1 | 3/2003 | Kanai |
| 2003/0072191 A1 | 4/2003 | Kamei |
| 2003/0072194 A1 | 4/2003 | Kamei |
| 2003/0076717 A1 | 4/2003 | Natori |
| 2003/0095443 A1 | 5/2003 | Natori |
| 2003/0103388 A1 | 6/2003 | Natori |
| 2003/0123303 A1 | 7/2003 | Kamei |
| 2003/0137875 A1 | 7/2003 | Natori |
| 2003/0146450 A1 | 8/2003 | Natori |
| 2003/0151070 A1 | 8/2003 | Natori |
| 2003/0164517 A1 | 9/2003 | Kamei et al. |
| 2003/0174558 A1 | 9/2003 | Kamei et al. |
| 2003/0179609 A1 | 9/2003 | Natori |
| 2003/0179621 A1 | 9/2003 | Kamei et al. |
| 2003/0185054 A1 | 10/2003 | Kamei |
| 2003/0198102 A1 | 10/2003 | Kamei et al. |
| 2003/0198103 A1 | 10/2003 | Kamei et al. |
| 2004/0013018 A1 | 1/2004 | Kanai |
| 2004/0013027 A1 | 1/2004 | Kanai |
| 2004/0061139 A1 | 4/2004 | Natori |

* cited by examiner

NON-VOLATILE MEMORY DEVICE

Japanese Patent Application No. 2002-364047, filed on Dec. 16, 2002, is hereby incorporated by reference in its entirety.

BACKGROUND OF THE INVENTION

The present invention relates to a non-volatile memory device including a non-volatile memory element controlled by a word gate and a select gate.

As an example of a non-volatile memory device, a Metal-Oxide-Nitride-Oxide-Semiconductor or -Substrate (MONOS) type of a non-volatile memory device is known. In the MONOS non-volatile memory device, a gate insulating film between a channel and a gate is formed of a laminate consisting of a silicon oxide film, a silicon nitride film, and a silicon oxide film and a charge is trapped in the silicon nitride film.

As the MONOS non-volatile memory device, a MONOS flash memory cell including a non-volatile memory element (MONOS memory element) controlled by one select gate and one word gate has been disclosed (see Japanese Patent Application Laid-open No. 6-181319, Japanese Patent Application Laid-open No. 11-74389, and U.S. Pat. No. 5,408,115, for example).

In this type of non-volatile memory device, an increase in speed of the read operation has been demanded. In the case where the non-volatile memory device transitions from a standby state to a read state, it is necessary to charge the word gate from 0 V during standby mode mode to a predetermined voltage. However, since the word gate may be formed of poly-silicon or the like, it takes time to charge the word gate. This increases the read cycle time, whereby the speed of the read operation cannot be increased.

BRIEF SUMMARY OF THE INVENTION

The present invention may provide a high-speed readable non-volatile memory device.

According to the present invention, there is provided a non-volatile memory device comprising:

a memory cell array including a plurality of memory cells arranged in a row direction and a column direction; and a power supply circuit supplying a voltage to the memory cells, wherein:

each of the memory cells has a source region, a drain region, a channel region disposed between the source region and the drain region, a word gate and a select gate disposed over the channel region with an insulator interposed, and a non-volatile memory element formed between the word gate and the channel region; and the power supply circuit has a precharge voltage supply section which supplies a precharge voltage to be applied to all the word gates in the memory cell array during standby mode.

Since the precharge voltage has been supplied to the word gates during the standby mode, a period of time necessary for applying the word gate voltage to the word gates can be shortened. This enables the subsequent reading time to be significantly reduced. Note that the non-volatile memory device is in the standby mode before reading.

All voltages applied to the word gates in the memory cell array may be set to the precharge voltage when data is read from a selected memory cell among the memory cells.

The memory cell array may further include a plurality of word lines extending in the row direction, and the word gates of the memory cells in each of the rows may be connected in common to one of the word lines.

All voltages of the word lines may be set to the precharge voltage during the standby mode and in the reading.

The memory cell array may further include a plurality of select lines extending in the row direction, and the select gates of the memory cells in each of the rows may be connected in common to one of the select lines.

Row selection may be performed in the reading by applying a selected voltage to a selected select gate which is connected to a selected memory cell selected in the reading, and by applying a non-selected voltage to a non-selected select gate.

Voltages applied to all the word gates connected to a non-selected word line among the word lines may be set to the precharge voltage when a memory cell selected from the memory cells is programmed by applying a selected word voltage to a selected word line connected to the selected memory cell.

The memory cell array may be divided into a plurality of blocks for erasing. At least one of the blocks may be selected for erasing when the precharge voltage is supplied to the word line in a non-selected block.

The precharge voltage supply section may supply a power voltage as the precharge voltage. This eliminates the need to change the voltage of the word gate in reading after standby, whereby the read access time can be reduced. Alternatively, the read access time may be reduced by setting the precharge voltage at a voltage close to the voltage of the word gate in reading.

Each of the memory cells may include a first region adjacent to the source region and a second region adjacent to the drain region, both the first and second regions being within the channel region. The select gate may be disposed over the first region, and the non-volaltile memory element may be disposed between the word gate and the second region.

Each of the memory cells may include a first region adjacent to the source region and a second region adjacent to the drain region, both the first and second regions being within the channel region. The non-volatile memory element may be disposed between the word gate and the first region, and the select gate may be disposed over the second region.

The non-volatile memory element may be formed of an ONO film which includes two oxide films (O), and a nitride film (N) disposed between the two oxide films (O).

DETAILED DESCRIPTION OF THE EMBODIMENT

An embodiment of the present invention is described below with reference to the drawings.

Entire Configuration and Structure of Memory Cell

Figure 1:
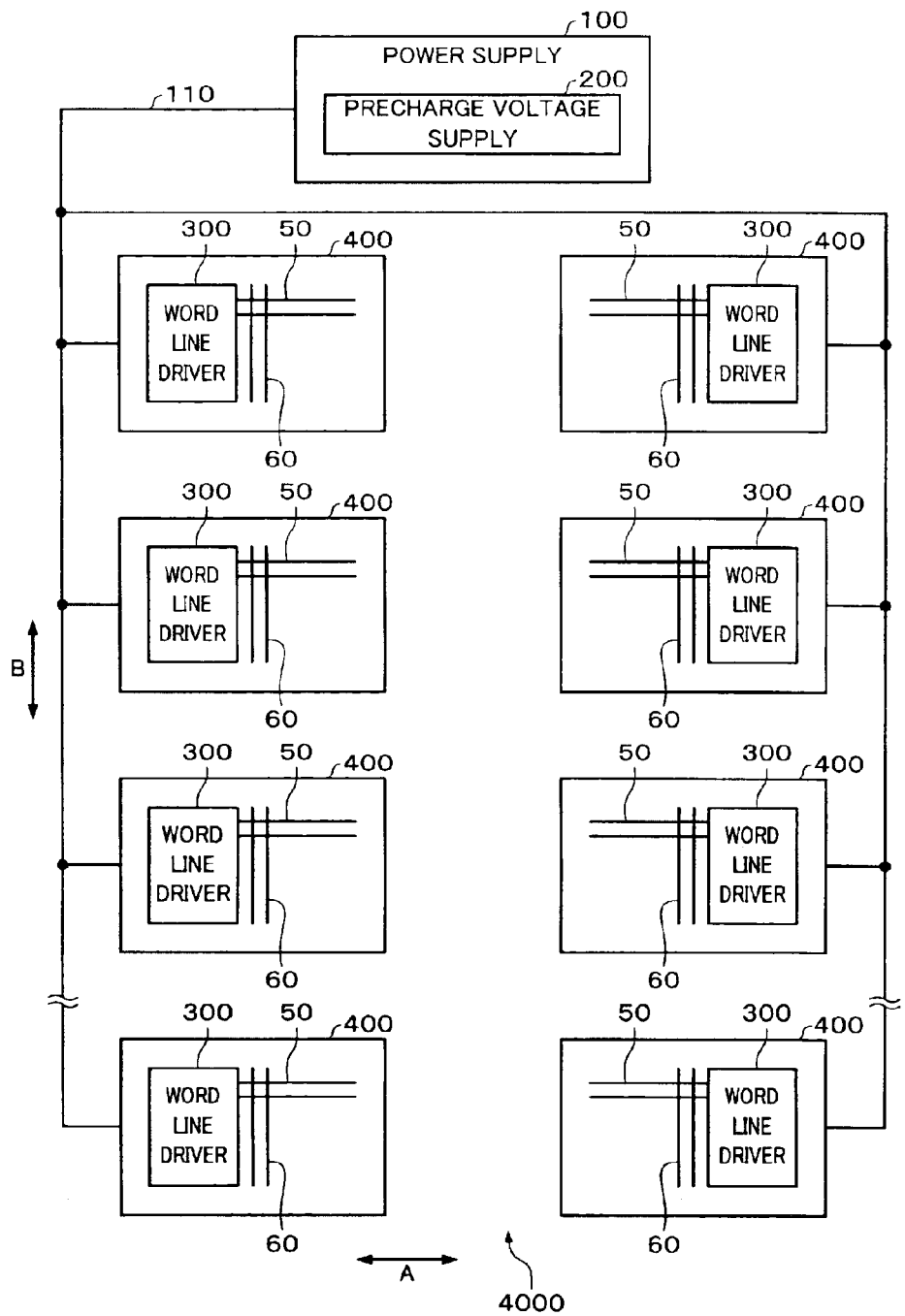
FIG. 1 is a block diagram showing the entire configuration of the non-volatile memory device according to one embodiment of the present invention.
Figure 2:
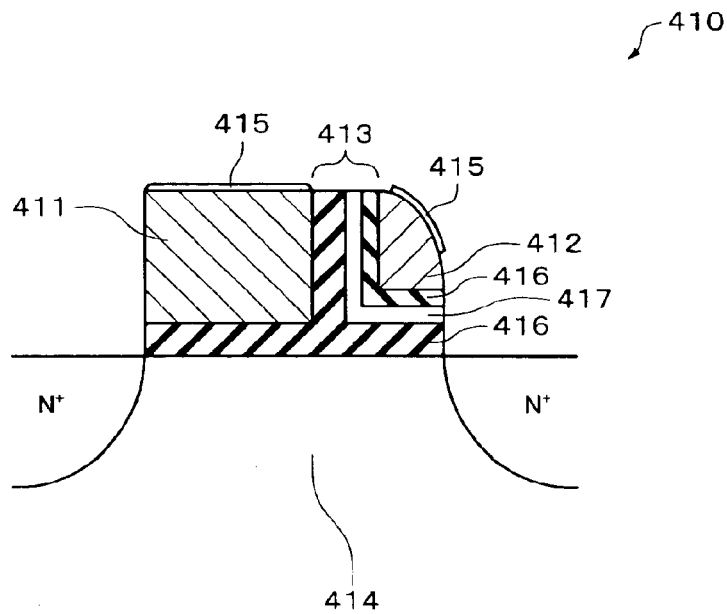
FIG. 2 is a cross-sectional view showing a memory cell according to one embodiment of the present invention.

FIG. 1 is a block diagram showing the entire configuration of a non-volatile memory device according to one embodiment of the present invention. A memory cell array 4000 of this embodiment is divided into a plurality of memory blocks 400 in units of data erasure. Each of the memory blocks 400 includes a word line driver 300. A plurality of word lines 50 extending along the row direction A are connected with each of the word line drivers 300. A plurality of sub bit lines 60 extending along the column direction B are provided in each of the memory blocks 400. The sub bit lines (hereinafter may be called "bit lines") 60 in the same column are connected with a main bit line through bit select switches (not shown). A bit line driver or a sense amplifier (not shown) is connected with the main bit line. In FIG. 1, a select line and its driver are omitted. A plurality of memory cells 410 shown in FIG. 2 are disposed in each of the memory blocks 400. Each of the memory cells 410 is selectively driven by the word line, the bit line, and the select line.

A power supply circuit 100 includes various voltage supply sections including a precharge voltage supply section 200. The power supply circuit 100 supplies a plurality of types of voltages to each of the word line drivers 300 and the like through a voltage supply line 110 corresponding to a signal from an external control circuit. These voltages are supplied through a plurality of supply lines. One of the supply lines is a precharge voltage supply line. The following description is given on the assumption that the voltage supply line 110 is the precharge voltage supply line.

A precharge voltage generated by the precharge voltage supply section 200 is supplied to each of the word line drivers 300 from the power supply circuit 100 through the precharge voltage supply line 110.

The memory block 400 including the selected memory cell 410 (hereinafter called "selected memory cell") is called a selected block, and the memory blocks 400 other than the selected memory block are called non-selected blocks.

FIG. 2 is a cross-sectional view showing the memory cell 410. The numeral 414 indicates a substrate. A select gate 411 and a word gate 412 are disposed on a channel region between source/drain regions (diffusion layers indicated by $N^+$ in FIG. 2) through an insulator film ($SiO_2$, for example). The insulator film may be formed of a nitride oxide film. An ONO film 413 is formed in the shape of the letter "L" between the word gate 412 and the channel region. The ONO film 413 need not be formed in the shape of the letter "L", but may merely be formed between the word gate 412 and the channel region. The select gate 411 and the word gate 412 may be formed of poly-silicon. The ONO film 413 may be formed so that a nitride film 417 (SiN, for example) is interposed between oxide films 416 ($SiO_2$, for example). A silicide 415 may be formed on the surfaces of the select gate 411 and the word gate 412. A Co silicide or Ti silicide may be used as the silicide 415. This enables the load resistance values of the select gate 411 and the word gate 412 to be decreased.

Figure 3:
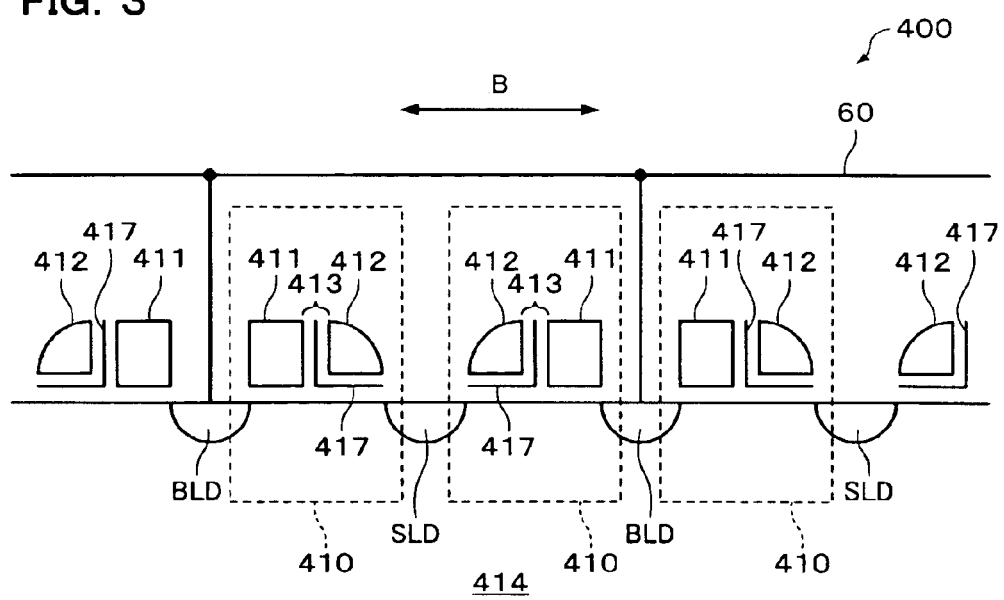
FIG. 3 is a cross-sectional view of part of a memory block according to one embodiment of the present invention.

FIG. 3 is a cross-sectional view showing part of the memory block 400 in this embodiment. In FIG. 3, the adjacent two memory cells 410 share the bit line diffusion layer BLD interposed between the select gates 411 of each of the two memory cells 410. The adjacent two memory cells 410 share the source line diffusion layer SLD interposed between the word gates 412 of each of the two memory cells 410. In the cross section shown in FIG. 3, each of the bit line diffusion layers BLD is connected in common with the bit line 60. The bit line diffusion layer BLD and the source line diffusion layer SLD may each be replaced by the other differing from the above structure. This structure is described later as a modification of this embodiment.

Figure 4:
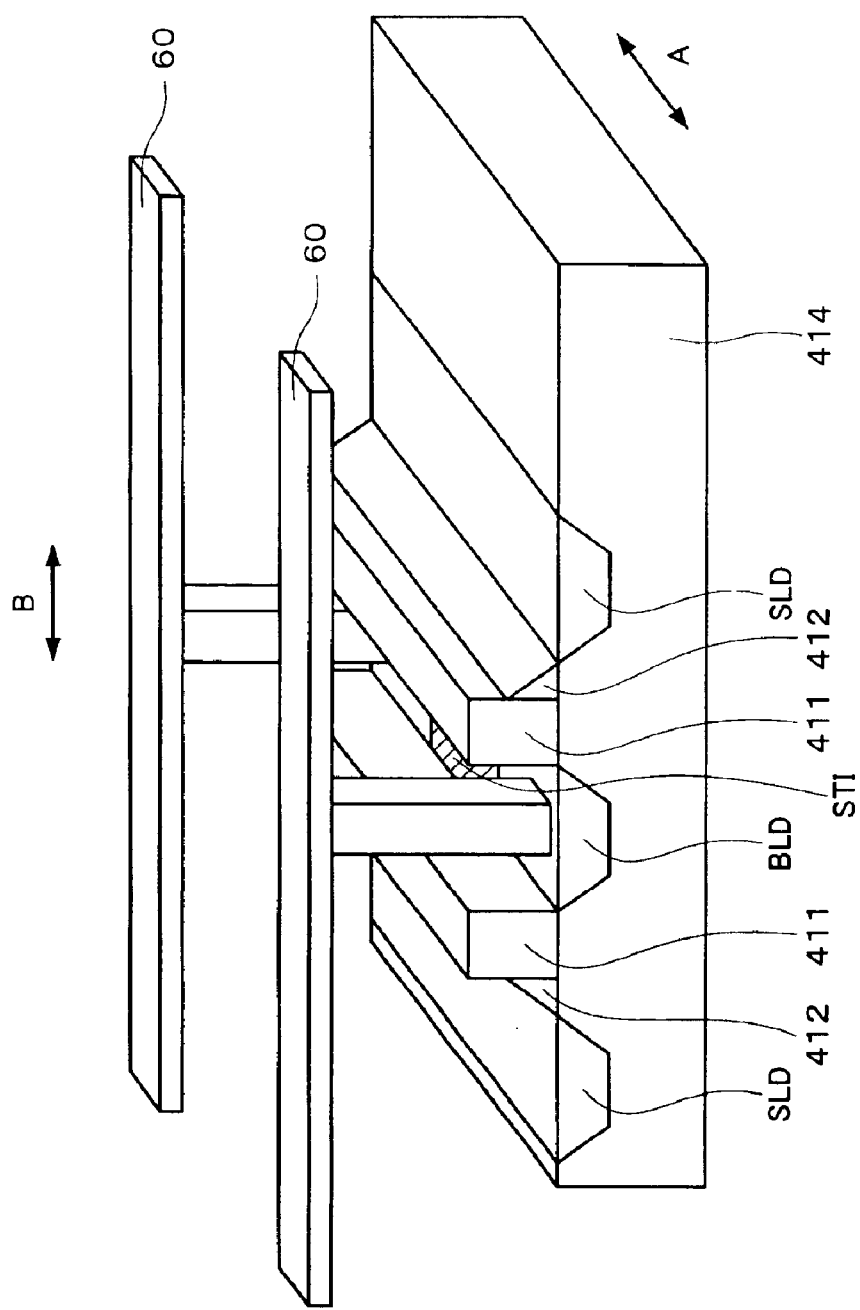
FIG. 4 is a schematic perspective view showing the memory block of FIG. 3.

FIG. 4 is a schematic perspective view showing the memory block of FIG. 3. In FIG. 4, the bit line diffusion layers BLD are isolated in the direction A by an element isolation section such as a shallow-trench-isolation (STI). This enables each of the bit lines 60 to be electrically isolated in units of the memory cells 410 arranged along the row direction A. Since the word gate 412 is continuously formed in the row direction A, the word gate 412 may be allowed to function as the word line 50. A metal interconnect may be backed along the word gate 412, and the metal interconnect may be allowed to function as the word line 50.

Figure 5:
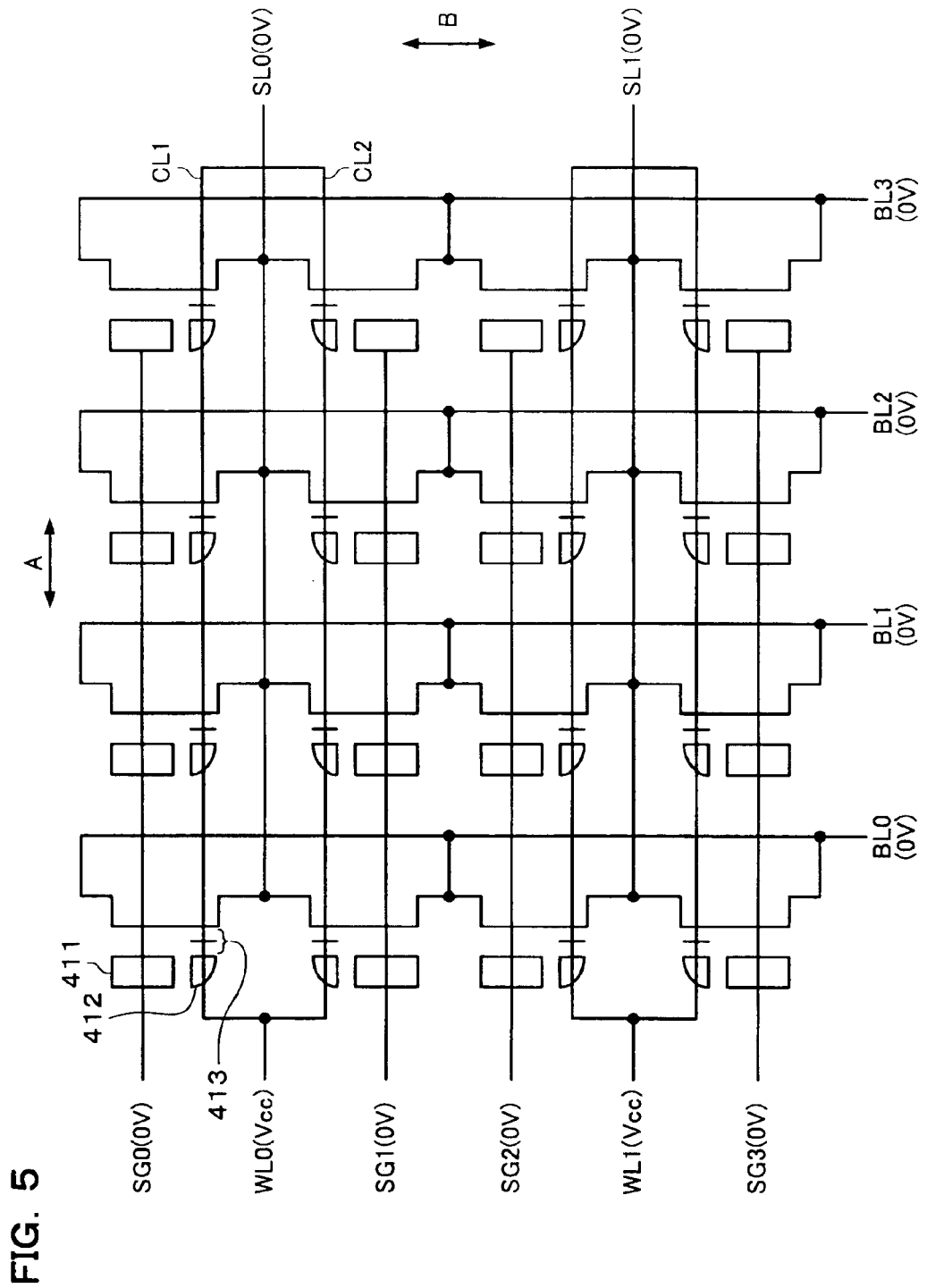
FIG. 5 is a circuit diagram showing voltages applied to the memory block in a standby mode.

FIG. 5 is an equivalent circuit diagram of one memory block 400. Symbols SG0 to SG3 indicate select gate lines (select lines), and symbols WL0 and WL1 indicate the word lines 50. Symbols SL0 and SL1 indicate source lines. In the following drawings, a section indicated by the same symbol as in FIG. 5 has the same meaning as in FIG. 5. In FIG. 5, the word line WL0 connects a common connect line CL1 which connects in common the word gates 412 adjacent to the select gates 411 to which the select gate line SG0 is connected, with a common connect line CL2 which connects in common the word gates 412 adjacent to the select gates 411 to which the select gate line SG1 is connected. Each of the common connect line CL1 and CL2 may be the word lines 50. In this embodiment, the layout area of the word line driver 300 can be reduced by connecting the common connect lines CL0 and CL1 by the word line WL0 as one word line 50. This also applies to the word line WL1.

Operation

The operation in this embodiment is described below separately for a standby operation, a read operation, a program operation, and an erase operation. In this embodiment, a state in which a charge is trapped in the ONO film 413 is defined as data "1", and a state in which a charge is not trapped in the ONO film 413 is defined as data "0". Specifically, programming used herein is the operation of writing data "1" in the selected memory cell.

Standby

During standby mode, the precharge voltage (voltage Vcc) is supplied to all the word lines 50 in the memory cell array 4000 by the function of the precharge voltage supply section 200 (see FIG. 5). The source lines SL0 and SL1 and the select gate lines SG0 to SG3 are set at a voltage of 0 V. In this embodiment, the precharge voltage is set at the power voltage Vcc. The precharge voltage may be determined depending on the voltage of the word line 50 connected with the selected memory cell during reading (hereinafter called "read voltage"). Since this embodiment aims at increasing the speed of the read operation, it is preferable that the voltage of the word line during standby mode be close to or the same as the read voltage (Vcc in this embodiment). In the case where the word line 50 connected with the selected memory cell during reading is set at a voltage of 1.5 V, the precharge voltage may also be set at a voltage of 1.5 V. In this embodiment, a regulator circuit for generating the precharge voltage is omitted by setting the read voltage at the power voltage (Vcc) and setting the precharge voltage at the voltage Vcc. The memory cell array 400 is always set in the standby state after the program operation or the erase operation.

Read

Figure 6:
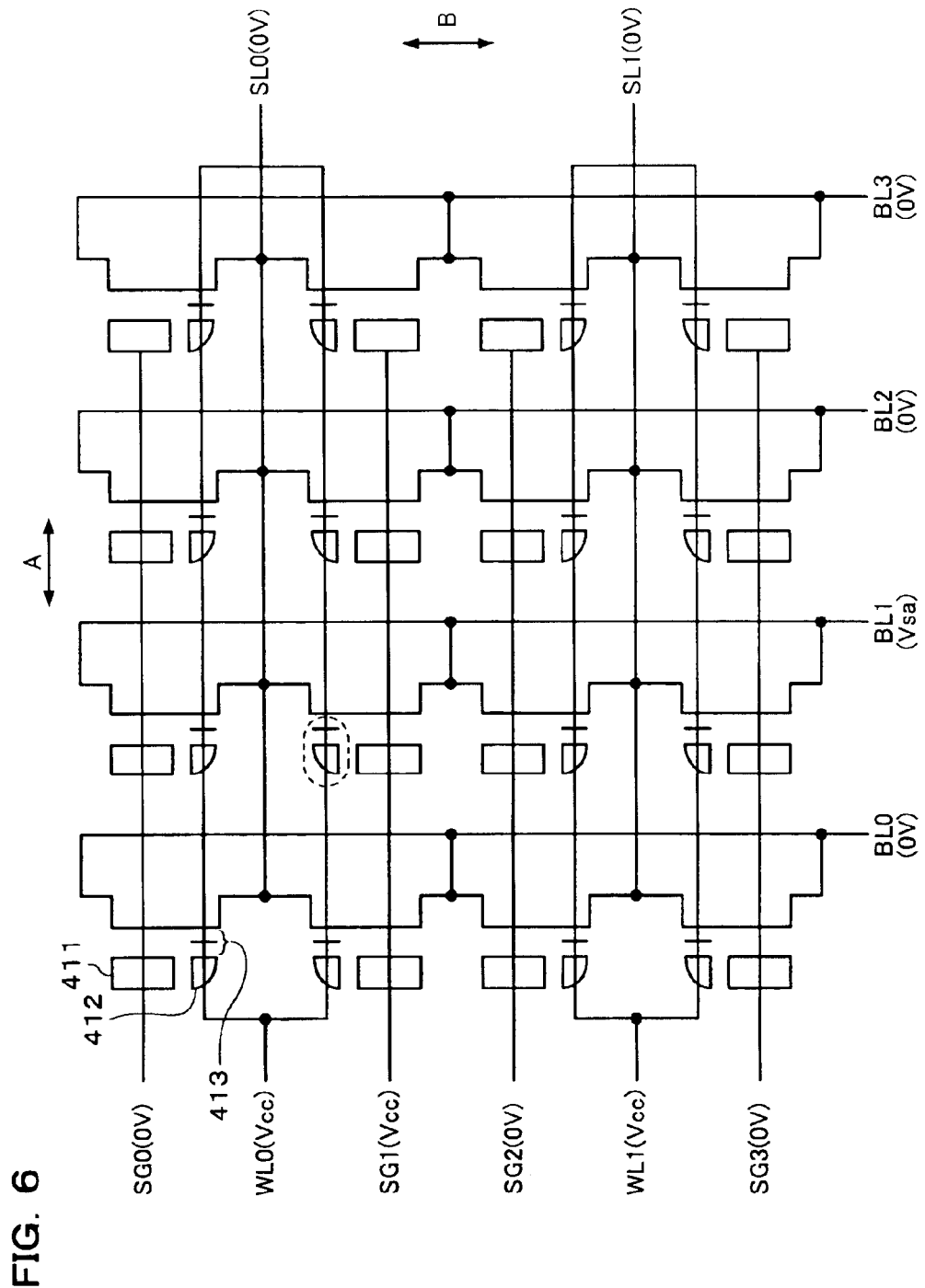
FIG. 6 is a circuit diagram showing voltages applied to a selected memory block in reading.

FIG. 6 is a circuit diagram showing the reading in the selected block. The memory cell 410 encircled by a dotted line is the selected memory cell. Since the word line WL0 has been precharged to the voltage Vcc during standby mode, the select gate line SG1 is charged to the voltage Vcc (hereinafter called "selected gate voltage"). This allows a channel to be formed between the bit line diffusion layer BLD and the source line diffusion layer SLD of the selected memory cell by the select gate 411 and the word gate 412 of the selected memory cell. The bit line BL1 has been charged to a voltage Vsa. The bit lines 60 other than the bit line BL1 are set at a voltage of 0 V. In this embodiment, the voltage Vsa is about 1 V. Therefore, current flows from the bit line BL1 to the source line SL0 set at a voltage of 0 V. In the case where a charge is not trapped in the ONO film 413, a greater amount of current flows through the channel region of the selected memory cell.

Figure 7:
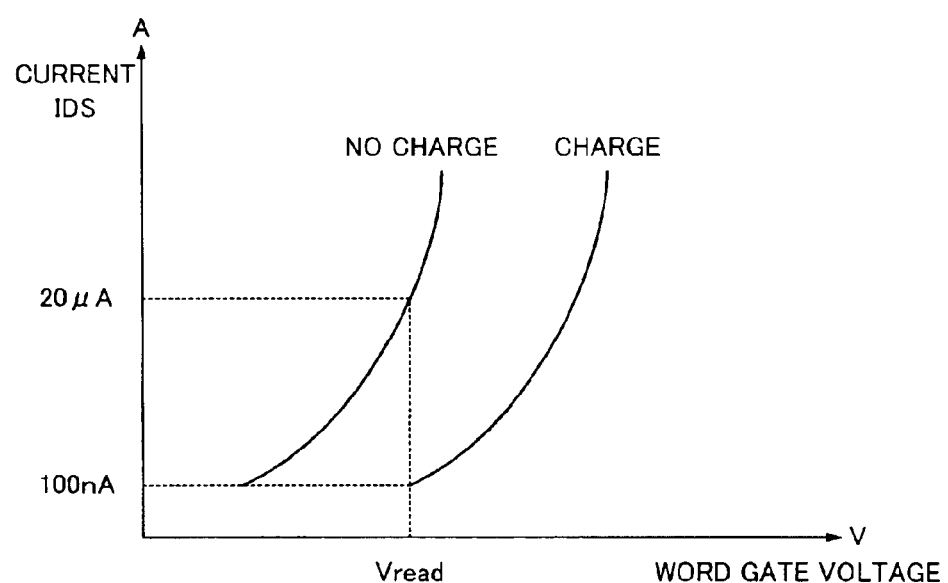
FIG. 7 is a graph showing the relationship between a charge in an ONO film and a current flowing through a bit line.

FIG. 7 shows the relationship between the charge in the ONO film 413 and a current IDS which flows between the source line diffusion layer SLD and the bit line diffusion layer BLD. A symbol Vread indicates the read voltage. As shown in FIG. 7, in the case where a charge is trapped in the ONO film 413, since the threshold value between the word gate 412 and the source line diffusion layer SLD is increased, the current IDS flows only to a small extent at the voltage Vread. In the case where a charge is not trapped in the ONO film 413, since the threshold value between the word gate 412 and the source line diffusion layer SLD is decreased, a large amount of current IDS flows. The data retained in the selected memory cell is distinguished by reading the amount of current IDS by using a sense amplifier (not shown).

As described above, the data is read by applying the selected gate voltage to the select gate 411 of the selected memory cell. Since the element load of each of the word gates 412 is high, it takes a considerable time to charge up the word line WL0 to the read voltage. In this embodiment, since the charge-up time is unnecessary, a considerable amount of access time can be reduced. Since the element load of each of the select gates 411 is considerably lower than the element load of each of the word gates 412, an increase in the speed is not hindered.

Table 1 shows the applied voltages in FIG. 6 in reading. A numerical value or Vcc in the cell in Table 1 indicates the voltage value. A symbol WL indicates the word lines 50, and a symbol SG indicates the select gate lines SG0 to SG3. A symbol SL indicates the source lines SL0 and SL1. A symbol BL indicates the bit lines 60. In Tables 2 and 3, a section indicated by the same symbol as in Table 1 has the same meaning as in Table 1.

TABLE 1

| | | Selected block | | |
|---|---|---|---|---|
| | | Non-selected memory cell | Selected memory cell | Non-selected block |
| Reading | WL | Vcc | Vcc | Vcc |
| | SG | 0 V or Vcc | Vcc | 0 V |
| | SL | 0 V | 0 V | 0 V |
| | BL | 0 V | Vsa | 0 V |

In Table 1, the cell of the symbol SG in the non-selected memory cell has a value of 0 V or Vcc. This is because each of the select gate lines SG0 to SG3 is connected in common with a plurality of the select gates 411. Specifically, the select gate 411 of the non-selected memory cell having the select gate 411 connected in common with the select gate 411 of the selected memory cell is at the voltage Vcc during reading. The select gate line among the select gate lines SG0 to SG3 which is connected with the select gate 411 of the selected memory cell is called a selected select gate line, and the select gate lines other than the selected select gate line are called non-selected select gate lines. A voltage applied to the non-selected select gate line is called a non-selected gate voltage.

The reverse reading is performed in this embodiment. Specifically, a high voltage is applied to the source line diffusion layer SLD during programming, and a high voltage is applied to the bit line diffusion layer BLD during reading. The reverse reading increases current read accuracy during reading. However, forward reading may be used as the read method. In this case, the voltage values applied to the source line diffusion layer SLD and the bit line diffusion layer BLD in this embodiment are each replaced by the other.

FIG. 5 is a circuit diagram showing voltages applied to the non-selected block. This voltage application state corresponds to the cells of the non-selected block shown in Table 1. Specifically, this voltage application state is the same as the standby state. The non-selected block is also in the same voltage application state as the standby state during programming and erasing.

Program

Figure 8:
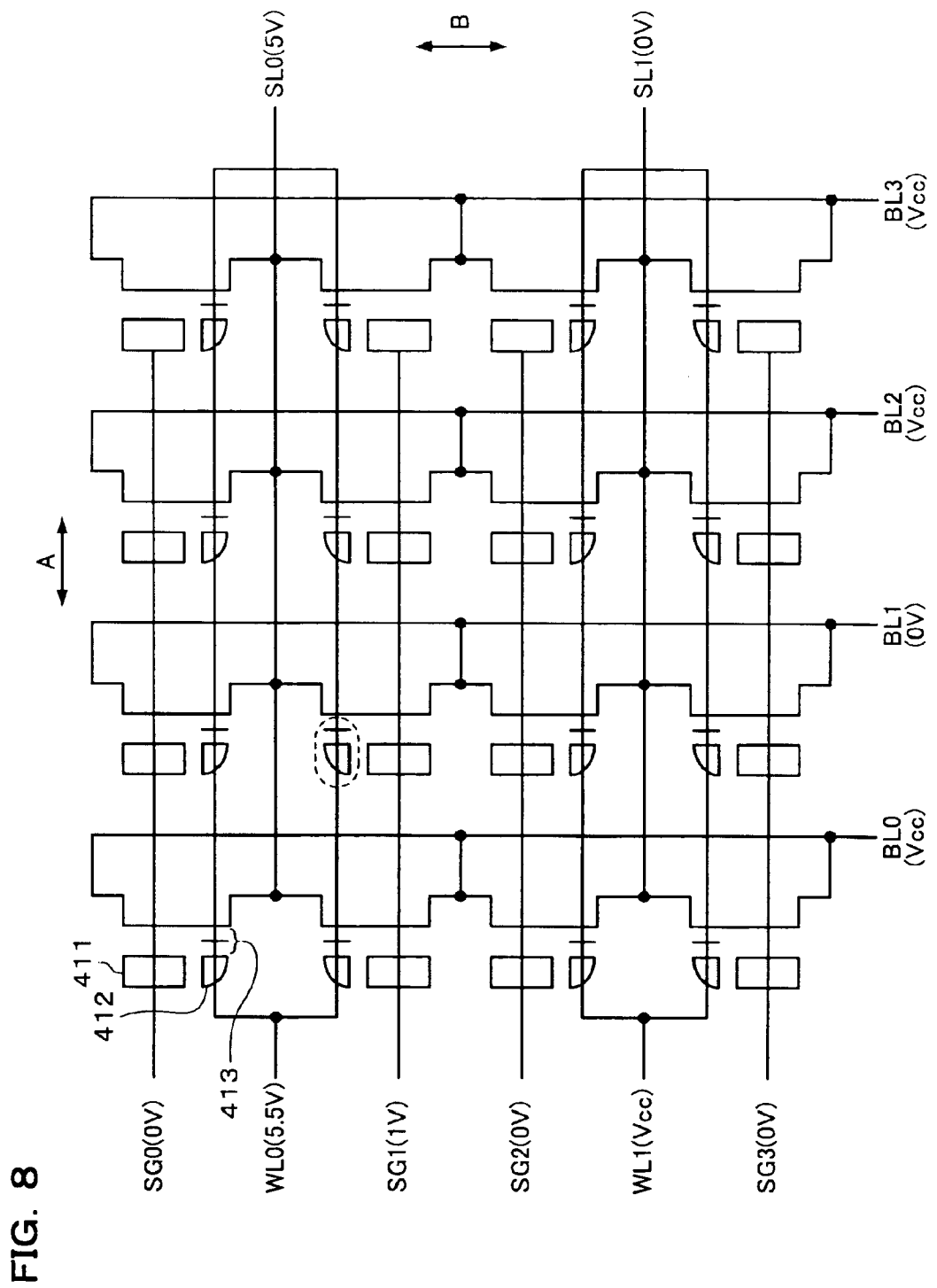
FIG. 8 is a circuit diagram showing voltages applied to a selected memory block in programming.

FIG. 8 shows voltages applied to a selected memory block in programming. A section encircled by a dotted line is the selected memory cell. The word line 50 connected with the selected memory cell is called a selected word line. The word line WL0 is charged to a voltage of 5.5 V, and the source line SL0 connected with the selected memory cell (hereinafter called "selected source line") is charged to a voltage of 5 V. The source line SL1 which is not connected with the selected memory cell (hereinafter called "non-selected source line") remains at a voltage of 0 V. The select gate line SG1 connected with the selected memory cell is charged to a voltage of 1 V, and the select gate lines SG0, SG2, and SG3 remain at a voltage of 0 V. The word line WL1 remains at the voltage Vcc. The bit line BL1 connected with the selected memory cell (hereinafter called "selected bit line") is charged to a voltage of 0 V.

In this case, electrons are released from the bit line diffusion layer BLD, and a channel is formed between the source line diffusion layer SLD and the bit line diffusion layer BLD. Since a voltage of 1 V is applied to the select gate 411, electrons released from the bit line diffusion layer BLD become hot electrons. Since a voltage of 5.5 V is applied to the word gate 412, the hot electrons are trapped in the ONO film 413. Writing of data "1" in the selected memory cell is completed in this manner.

The bit lines BL0, BL2, and BL3 are set at the voltage Vcc. As a result, since a large amount of current does not flow toward the bit line 60 from the word gate 412 of the non-selected memory cell, a charge is not trapped in the ONO film 413 of the non-selected memory cell. Therefore, erroneous writing of data does not occur even if the voltage of 5.5 V is applied to the word gate 412 of the non-selected memory cell connected in common with the same word line 50 as the selected memory cell.

Table 2 shows applied voltages in FIG. 8 in programming.

TABLE 2

|  |  | Selected block | | |
|---|---|---|---|---|
|  |  | Non-selected memory cell | Selected memory cell | Non-selected block |
| Programming | WL | 5.5 V or Vcc | 5.5 V | Vcc |
|  | SG | 0 V or 1 V | 1 V | 0 V |
|  | SL | 0 V | 5 V | 0 V |
|  | BL | Vcc | 0 V | 0 V |

The cell of the symbol WL in the non-selected memory cell has a value of 5.5 V or Vcc. This is because the non-selected memory cell connected with the selected word line and the non-selected memory cell which is not connected with the selected word line are present. The cell of the symbol SG in the non-selected memory cell has a value of 0 V or 1 V. This is because the non-selected memory cell connected with the selected select gate line and the non-selected memory cell which is not connected with the selected select gate line are present.

The non-selected block is in the same voltage application state as the standby state as described above (see FIG. 5).

Erase

Figure 9:
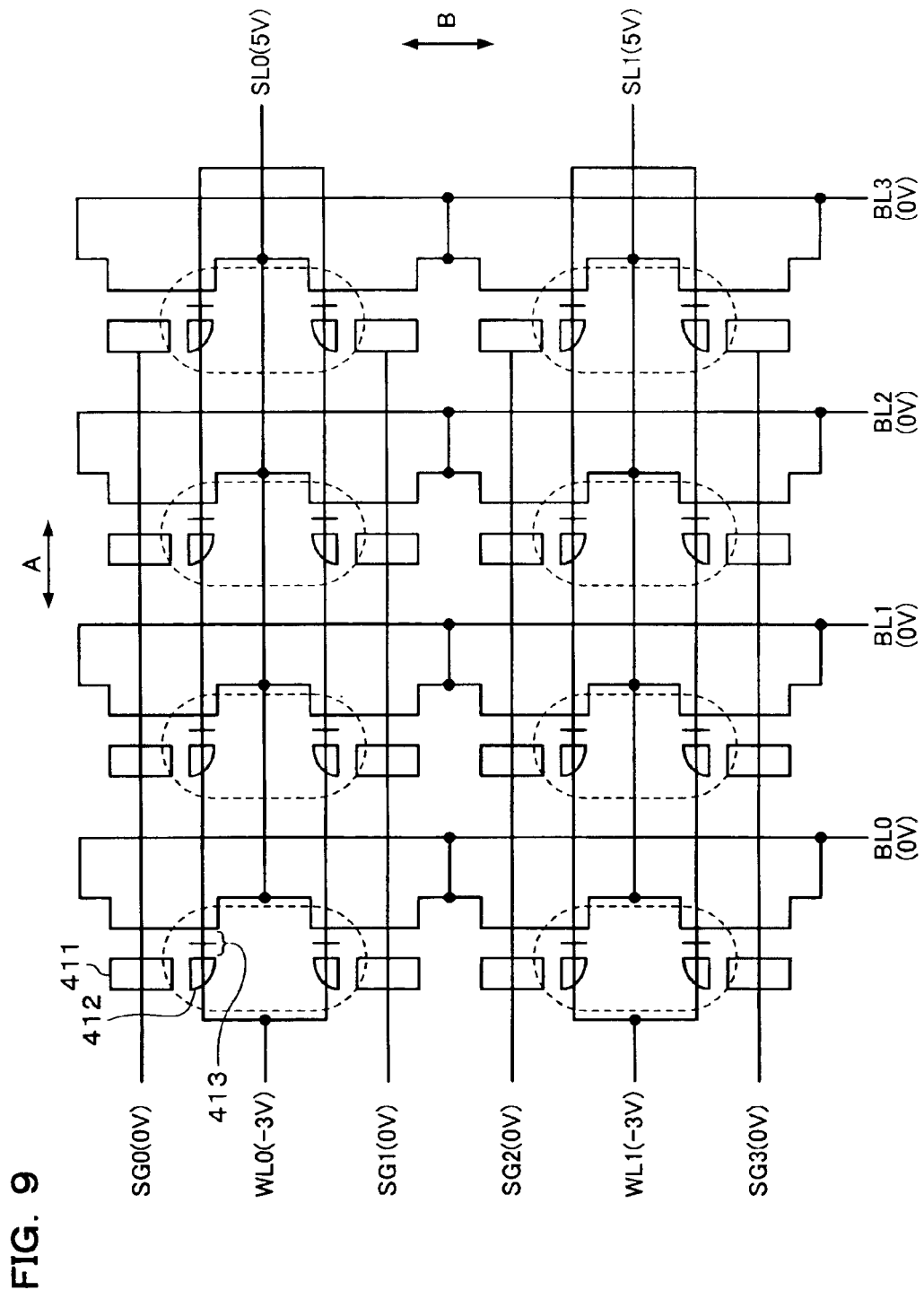
FIG. 9 is a circuit diagram showing voltages applied to a selected memory block in erasing.

FIG. 9 shows voltages applied to a selected memory block in erasing. Sections encircled by dotted lines are the selected memory cells. Specifically, all the memory cells 410 in the selected block are the selected memory cells during erasing. The selected word lines are charged to a voltage of −3 V, and the selected select gate lines are set at a voltage of 0 V The source lines SL0 and SL1 are charged to a voltage of 5 V, and all the bit lines 60 in the selected block are set at a voltage of 0 V. This allows a channel to be formed between the source line diffusion layer SLD and the bit line diffusion layer BLD. However, since each of the word gates 412 of the memory cells 410 in the selected block is charged to a voltage of −3 V, an electric field is generated between each of the word gates 412 and the source line diffusion layer SLD. The charge (electrons) which has been trapped in the ONO film 413 can be erased by hot holes generated by the application of the electric field.

In this embodiment, the data is erased by the hot holes. However, the data may be erased by using a Fowler-Nordheim (FN) erase method. This method uses FN tunneling. The principle of this method is that the charge (electrons) in the ONO film is released from the ONO film 413 by FN tunneling by applying a predetermined electric field (voltage difference of 15 V, for example) to the ONO film 413.

The state of voltages applied to the non-selected block in this time is the same as the state of applied voltages in the standby mode as described above (see FIG. 5).

Table 3 shows applied voltages in FIG. 9 in erasing.

TABLE 3

|  |  | Selected block | Non-selected |
|---|---|---|---|
|  |  | Selected memory cell | block |
| Erasing | WL | −3 V | Vcc |
|  | SG | 0 V | 0 V |
|  | SL | 5 V | 0 V |
|  | BL | 0 V | 0 V |

Comparison Between This Embodiment and Comparative Example

Figure 10:
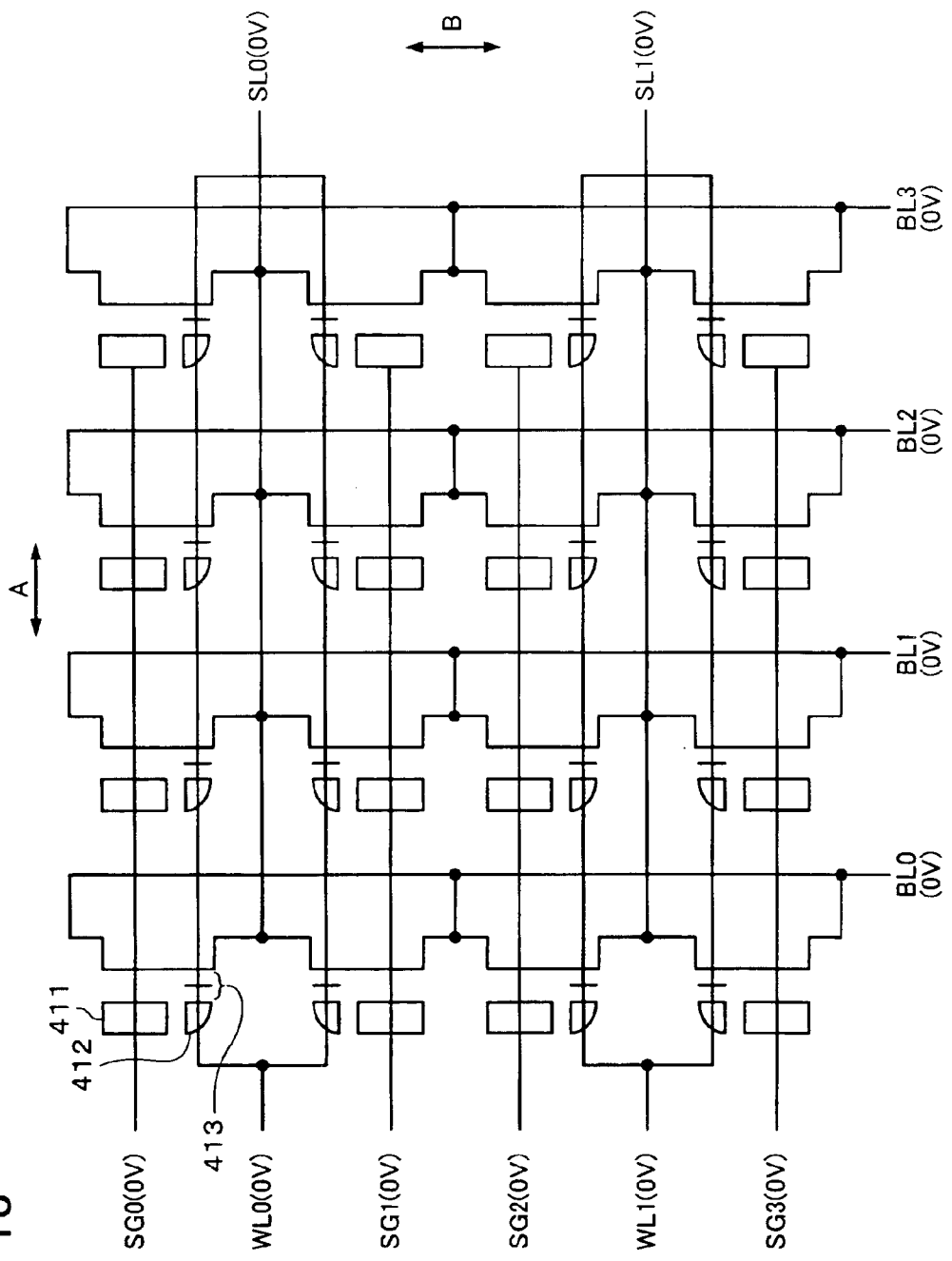
FIG. 10 is a circuit diagram showing voltages applied to a selected memory block of a comparative example of the embodiment of the present invention in a standby mode.

FIG. 10 is a circuit diagram showing voltages applied to a selected memory block of a comparative example of this embodiment in a standby mode. All the word lines 50, bit lines 60, and select gate lines SG0 to SG3, and source lines SL0 and SL1 in the memory cell array 4000 are set at a voltage of 0 V. In the comparative example, the state of voltages applied to the non-selected block in reading, programming, and erasing is the same as the state of applied voltages in the standby mode.

Figure 11:
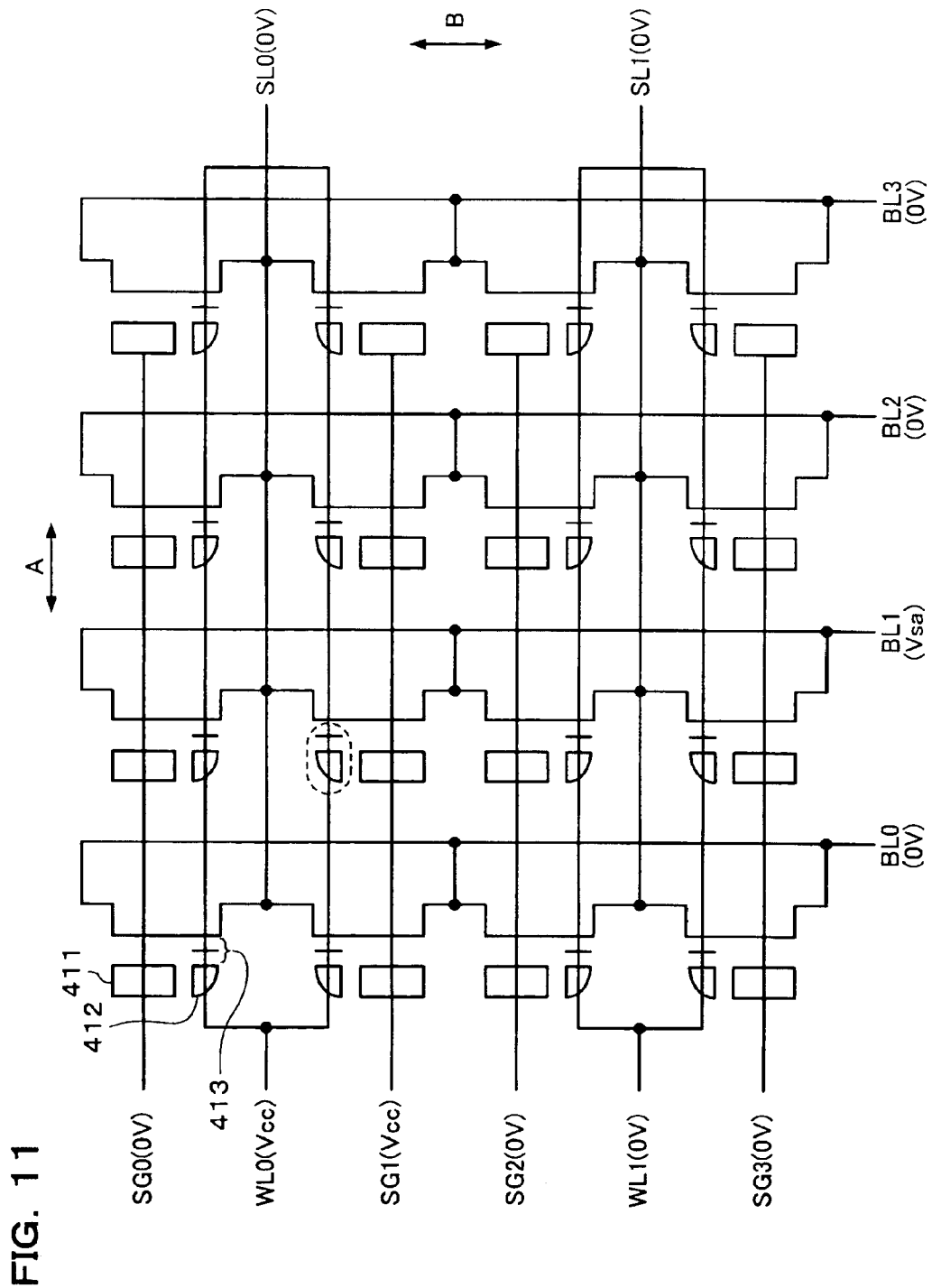
FIG. 11 is a circuit diagram showing voltages applied to a selected memory block of a comparative example of the embodiment of the present invention in reading.

FIG. 11 shows voltages applied to a selected memory block of the comparative example of this embodiment in reading. A section encircled by a dotted line is the selected memory cell. In the comparative example, the word line WL0 is charged to the read voltage Vcc during reading. The word line WL1 remains at the same voltage (0 V) as in the standby state. Since the element load of the word gate 412 is high, it takes a certain time to charge up the word gate 412 to the read voltage Vcc. Since this results in an increase in the access time, such a configuration cannot be utilized for a storage device for which an access time of 70 ns is required.

Figure 12:
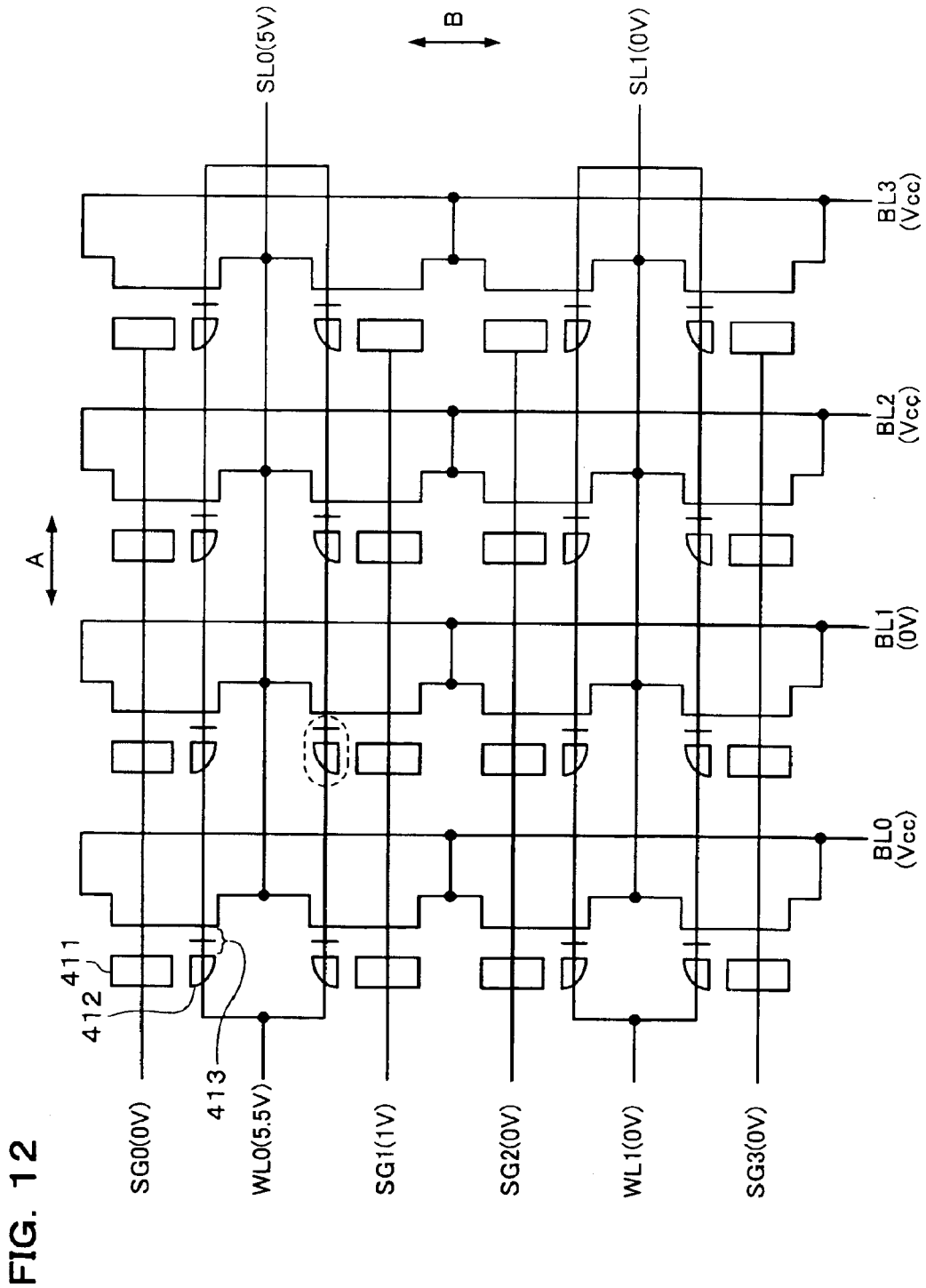
FIG. 12 is a circuit diagram showing voltages applied to a selected memory block of a comparative example of the embodiment of the present invention in programming.

FIG. 12 is a circuit diagram showing voltages applied to a selected memory block of the comparative example of this embodiment in programming. The difference between the comparative example and this embodiment is the voltage of the word line WL1.

Figure 13:
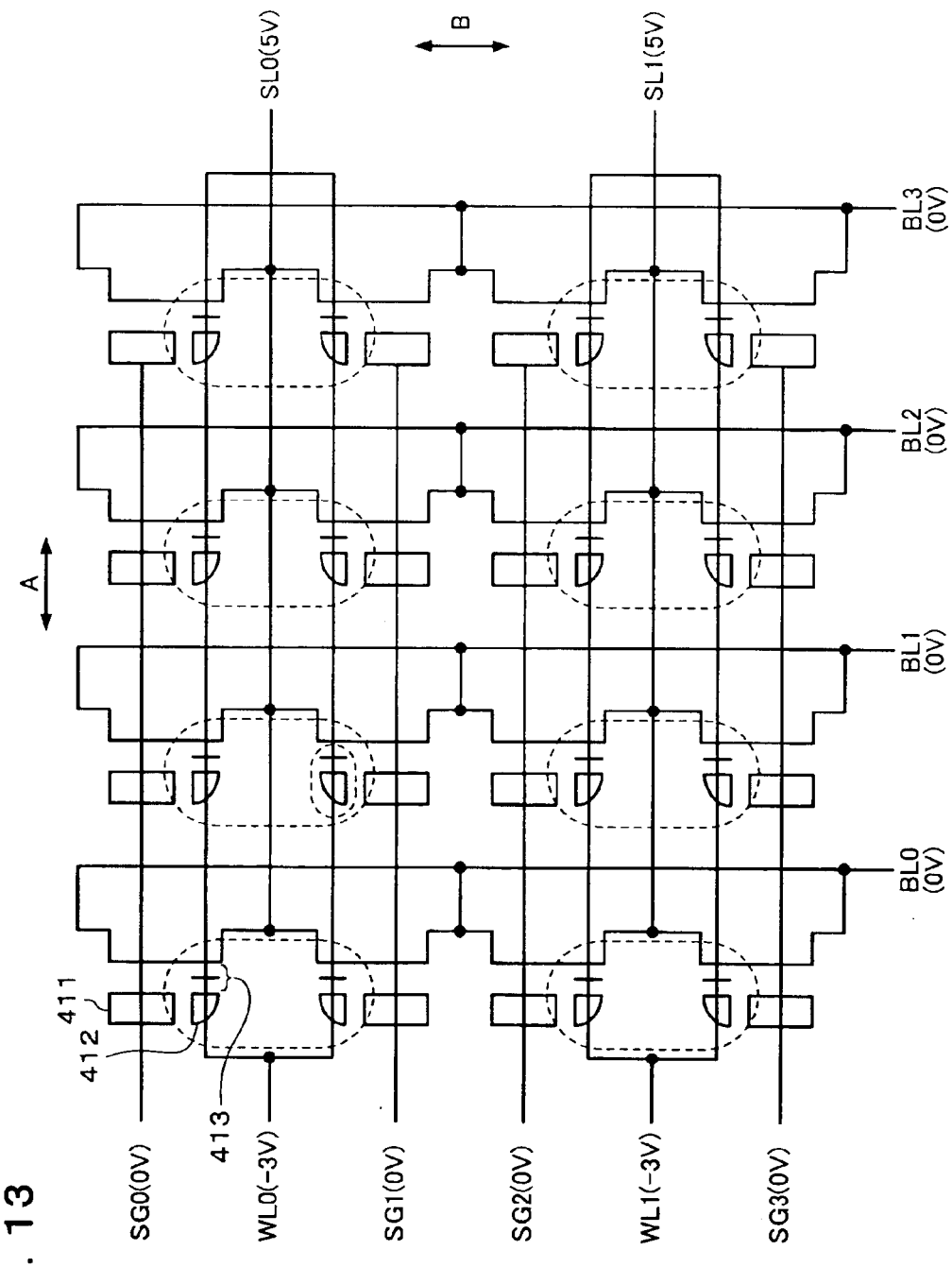
FIG. 13 is a circuit diagram showing voltages applied to a selected memory block of a comparative example of the embodiment of the present invention in erasing.

FIG. 13 is a circuit diagram showing voltages applied to a selected memory block of the comparative example of this embodiment in erasing. The state of applied voltages in the comparative example is the same as that of this embodiment only in erasing.

Figure 14:
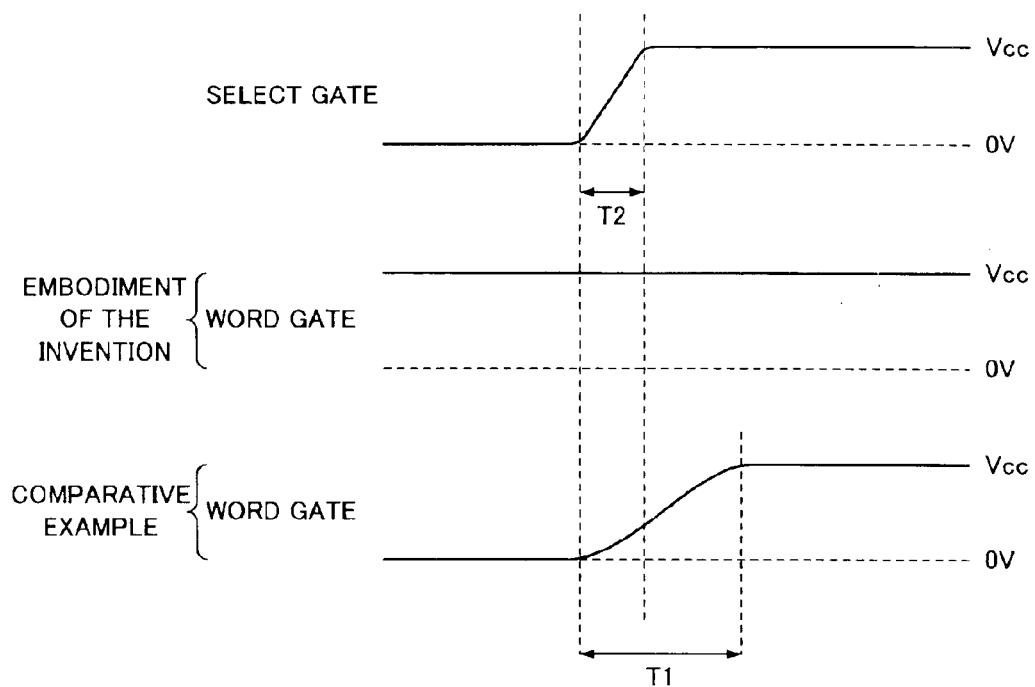
FIG. 14 is a waveform chart of applied voltages for representing the effect of the present invention.

FIG. 14 is a waveform chart showing the time required for reading the data of the selected memory cell in this embodiment and the comparative example. Symbols T1 and T2 indicate time periods. In FIG. 14, the time period T1 indicates the time necessary for the word gate 412 to rise to the voltage Vcc in the comparative example after applying the read voltage. The time period T2 indicates the time necessary for the select gate 411 to rise to the voltage Vcc after applying a voltage to the select gate 411. In this embodiment, since the word gate 412 has been charged to the voltage Vcc during standby mode, the word gate 412 is always at the voltage Vcc during reading. Specifically, the time period T1 is necessary for applying the read voltage in the comparative example. However, in this embodiment, the application of the read voltage is completed within the time period T2. The access time can be reduced in an amount corresponding to the difference between the time period T1 and the time period T2.

As described above, the access time during reading can be significantly reduced in this embodiment. It is necessary to charge up the word gate to a voltage equal to or higher than the precharge voltage during programming. However, the access time can also be reduced by the precharge effect.

In this embodiment, the access time can be reduced in an amount of about 100 ns during reading. This enables this embodiment to be utilized for a storage device for which an access time of 70 ns is required.

Modification

Figure 15:
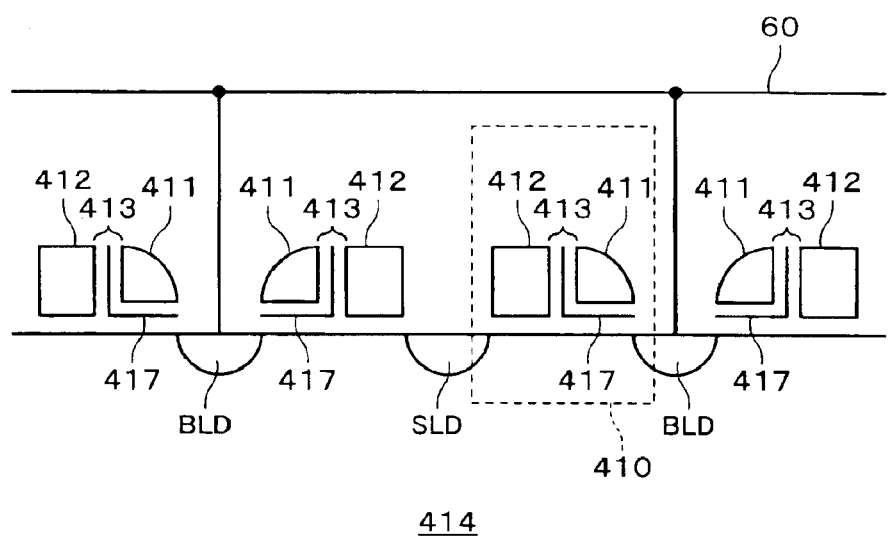
FIG. 15 is a cross-sectional view showing a memory cell array of a modification of the embodiment of the present invention.

FIG. 15 shows a modification of the embodiment of the present invention. The difference between the modification and the embodiment is the memory cell 410 structure. In FIG. 15, the word gate 412 is disposed on the side of the bit line diffusion layer BLD, and the select gate 411 is disposed on the side of the source line diffusion layer SLD. The ONO film 413 is disposed so as to be interposed between the channel region formed between the source line diffusion layer SLD and the bit line diffusion layer BLD and the word gate 412.

Applied voltages in the standby mode, reading, programming, and erasing will be described below.

The applied voltages in the standby mode is similar to that in the standby mode of this embodiment of the present invention.

The voltages applied to the non-selected block in reading, programming, and erasing are the same as the applied voltages during the standby mode of this embodiment.

In the selected block during reading, the voltage Vsa is applied to the selected source line, and the non-selected source line remains at a voltage of 0 V. All the bit lines 60 remain at a voltage of 0 V. All the word lines 50 are precharged to the voltage Vcc in the same manner as in this embodiment. The selected select gate line is charged to the voltage Vcc in the same manner as in this embodiment.

In the selected block during programming, a voltage of 0 V is applied to the selected source line, and the voltage Vcc is applied to the non-selected source line. A voltage of 5 V is applied to the selected bit line, and the bit lines 60 other than the selected bit line remain at a voltage of 0 V. The selected word line is charged to a voltage of 5.5 V, and the word lines 50 other than the selected word line remain at the voltage Vcc as in the standby state. A voltage of 1 V is applied to the selected select gate line, and the non-selected select gate line remains at a voltage of 0 V as in the standby state.

In the selected block during erasing, a voltage of −3 V is applied to all the word lines 50, and a voltage of 5 V is applied to all the bit lines 60 in addition to the applied voltages in the standby mode.

The modification differs from this embodiment of the invention in the structure and the state of applied voltages. However, the effect of the modification is the same as the effect of this embodiment. The forward reading is also possible in the modification in the same manner as in this embodiment.

As described above, the present invention can provide a high-speed accessible non-volatile memory device.

The voltage values described in the detailed description of the invention are only examples of this embodiment. The voltage values can be set in the range corresponding to the characteristics of the element, material, and the like. The present invention is not limited to the above-described embodiment. Various modifications and variations are possible within the scope of the invention.

What is claimed is:

1. A non-volatile memory device comprising:

a memory cell array including a plurality of memory cells arranged in a row direction and a column direction; and a power supply circuit supplying a voltage to the memory cells, wherein:

each of the memory cells has a source region, a drain region, a channel region disposed between the source region and the drain region, a word gate and a select gate disposed over the channel region with an insulator interposed, and a non-volatile memory element formed between the word gate and the channel region; and the power supply circuit has a precharge voltage supply section which supplies a precharge voltage to be applied to all the word gates in the memory cell array during standby mode.

2. The non-volatile memory device as defined in claim 1, wherein all voltages applied to the word gates in the memory cell array are set to the precharge voltage when data is read from a selected memory cell among the memory cells.

3. The non-volatile memory device as defined in claim 2, wherein:

the memory cell array further includes a plurality of word lines extending in the row direction, the word gates of the memory cells in each of the rows being connected in common to one of the word lines; and all voltages of the word lines are set to the precharge voltage during the standby mode and in the reading.

4. The non-volatile memory device as defined in claim 3, wherein:

the memory cell array further includes a plurality of select lines extending in the row direction, the select gates of the memory cells in each of the rows being connected in common to one of the select lines; and row selection is performed in the reading by applying a selected voltage to a selected select gate which is connected to a selected memory cell selected in the reading, and by applying a non-selected voltage to a non-selected select gate.

5. The non-volatile memory device as defined in claim 1, wherein voltages applied to all the word gates connected to a non-selected word line among the word lines are set to the precharge voltage when a memory cell selected from the memory cells is programmed by applying a selected word voltage to a selected word line connected to the selected memory cell.

6. The non-volatile memory device as defined in claim 1, wherein:

the memory cell array is divided into a plurality of blocks for erasing; and at least one of the blocks is selected for erasing when the precharge voltage is supplied to the word line in a non-selected block.

7. The non-volatile memory device as defined in claim 1, wherein the precharge voltage supply section supplies a power voltage as the precharge voltage.

8. The non-volatile memory device as defined in claim 1, wherein:

each of the memory cells includes a first region adjacent to the source region and a second region adjacent to the drain region, both the first and second regions being within the channel region; and the select gate is disposed over the first region, and the non-volatile memory element is disposed between the word gate and the second region.

9. The non-volatile memory device as defined in claim 1, wherein:

each of the memory cells includes a first region adjacent to the source region and a second region adjacent to the drain region, both the first and second regions being within the channel region; and the non-volatile memory element is disposed between the word gate and the first region, and the select gate is disposed over the second region.

10. The non-volatile memory device as defined in claim 1, wherein the non-volatile memory element is formed of an ONO film which includes two oxide films (O), and a nitride film (N) disposed between the two oxide films (O).

11. The non-volatile memory device as defined in claim 1, wherein the non-volatile memory element is disposed between the select gate and the word gate.

12. The non-volatile memory device as defined in claim 10, wherein the insulator is formed of one of the two oxide films.

* * * * *